US012701813B2

(12) United States Patent
Mitarai

(10) Patent No.: US 12,701,813 B2
(45) Date of Patent: Aug. 4, 2026

(54) SEMICONDUCTOR PACKAGE

(71) Applicant: SONY SEMICONDUCTOR SOLUTIONS CORPORATION, Kanagawa (JP)

(72) Inventor: Shun Mitarai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 295 days.

(21) Appl. No.: 18/576,510

(22) PCT Filed: Feb. 21, 2022

(86) PCT No.: PCT/JP2022/006956
§ 371 (c)(1),
(2) Date: Jan. 4, 2024

(87) PCT Pub. No.: WO2023/002656
PCT Pub. Date: Jan. 26, 2023

(65) Prior Publication Data
US 2025/0098356 A1      Mar. 20, 2025

(30) Foreign Application Priority Data

Jul. 21, 2021    (JP) ................................. 2021-120185

(51) Int. Cl.
H10F 39/00          (2025.01)
H10W 74/10          (2026.01)
(52) U.S. Cl.
CPC .......... H10F 39/811 (2025.01); H10F 39/011 (2025.01); H10F 39/804 (2025.01); H10F 39/8057 (2025.01); H10W 74/124 (2026.01)
(58) Field of Classification Search
CPC .... H10F 39/811; H10F 39/011; H10F 39/804; H10F 39/8057; H10F 39/806;
(Continued)

(56) References Cited

U.S. PATENT DOCUMENTS 10,763,286 B2 *    9/2020   Hogyoku .............. H10F 39/804
10,903,255 B2 *    1/2021   Wu ........................ H10F 39/804
(Continued)

FOREIGN PATENT DOCUMENTS

JP        2010-213034        9/2010
JP        2012-134397        7/2012
(Continued)

OTHER PUBLICATIONS

English Translation of International Search Report prepared by the Japan Patent Office on May 19, 2022, for International Application No. PCT/JP2022/006956, 3 pgs.

*Primary Examiner* — Victor A Mandala
(74) *Attorney, Agent, or Firm* — SHERIDAN ROSS P.C.

(57)                ABSTRACT

Provided is a semiconductor package further reduced in size. A semiconductor package, including a mounting substrate; a semiconductor chip having a smaller area than the mounting substrate and mounted on a main surface of the mounting substrate; a sealing glass facing the semiconductor chip and the mounting substrate, connected to the mounting substrate by a substrate connection part, and connected to the semiconductor chip by a chip connection part; and a connection wiring layer provided on a first surface of the sealing glass that faces the mounting substrate and the semiconductor chip, and electrically connected to the mounting substrate and the semiconductor chip via the substrate connection part and the chip connection part, wherein the mounting substrate, the semiconductor chip, and the sealing glass have approximately the same thermal expansion coefficient.

16 Claims, 22 Drawing Sheets

2

(58) Field of Classification Search
CPC ... H10W 76/60; H10W 70/635; H10W 70/69; H10W 72/20; H10W 74/131; H10W 76/12; H10W 74/124; H10W 76/153
See application file for complete search history.

(56) References Cited

U.S. PATENT DOCUMENTS

| | | | | |
|---|---|---|---|---|
| 2003/0064540 A1* | 4/2003 | Auch | ................... | H10W 95/00 |
| | | | | 438/99 |
| 2007/0158855 A1* | 7/2007 | Minamio | ............. | H10W 90/00 |
| | | | | 257/E23.174 |
| 2007/0252227 A1 | 11/2007 | Fukuda | | |
| 2008/0029780 A1* | 2/2008 | Ohtsuka | ............... | H10H 20/854 |
| | | | | 257/E33.059 |
| 2010/0003779 A1* | 1/2010 | Watanabe | ............. | H10F 39/026 |
| | | | | 257/E21.499 |
| 2010/0231766 A1 | 9/2010 | Moriya et al. | | |
| 2011/0207257 A1* | 8/2011 | Watanabe | ............. | H10F 39/804 |
| | | | | 438/66 |
| 2015/0255500 A1 | 9/2015 | Akahoshi et al. | | |
| 2016/0276544 A1* | 9/2016 | Shiratori | ................. | C03C 3/091 |
| 2018/0211989 A1 | 7/2018 | Hogyoku | | |
| 2018/0366385 A1 | 12/2018 | Hashimoto et al. | | |
| 2021/0143199 A1 | 5/2021 | Wu | | |

FOREIGN PATENT DOCUMENTS

| | | |
|---|---|---|
| JP | 2015-179788 | 10/2015 |
| JP | 2017-143092 | 8/2017 |
| JP | 2018-026395 | 2/2018 |
| WO | WO 2014/083750 | 6/2014 |
| WO | WO 2015/122299 | 8/2015 |

* cited by examiner

130A

111

110

SEMICONDUCTOR PACKAGE

CROSS REFERENCE TO RELATED APPLICATIONS

This application is a national stage application under 35 U.S.C. 371 and claims the benefit of PCT Application No. PCT/JP2022/006956, having an international filing date of 21 Feb. 2022, which designated the United States, which PCT application claimed the benefit of Japanese Patent Application No. 2021-120185, filed 21 Jul. 2021, the entire disclosures of each of which are incorporated herein by reference.

TECHNICAL FIELD

The present disclosure relates to a semiconductor package.

BACKGROUND ART

A semiconductor chip such as an image sensor chip, a memory chip, or an IC (Integrated Circuit) chip is mounted on a mounting substrate for the purpose of heat dissipation to the outside, protection from the external environment, electrical connection to the outside, and the like. In such a semiconductor package, the semiconductor chip and the mounting substrate are electrically connected to each other by means of, for example, wire bonding using a lead frame.

On the other hand, as portable devices get smaller in recent years, miniaturization of a package for housing a semiconductor chip has been desired. Therefore, making the package smaller by reducing the area of the outer peripheral region of the mounting substrate is being considered.

For example, PTL 1 below discloses a so-called fan-out-type package for flip-chip packaging a semiconductor chip on a transparent mounting substrate functioning as sealing glass. In the package disclosed in PTL 1, the semiconductor chip is electrically connected to the mounting substrate not by wire bonding but by contact points such as bumps provided in an outer peripheral region of the semiconductor chip. In this manner, the package disclosed in PTL 1 can further reduce the area of the mounting substrate.

CITATION LIST

Patent Literature

PTL 1: JP 2018-26395A

SUMMARY

Technical Problem

Unfortunately, depending on the applications, it is difficult for the package disclosed in PTL 1 to sufficiently reduce the size of the mounting substrate. For example, in the package disclosed in PTL 1, contact points for secondary connection between the mounting substrate and another mounting substrate are arranged only in the outer peripheral region of the mounting substrate. Consequently, when the number of contact points for secondary connection increases, the outer peripheral region of the mounting substrate expands in the package disclosed in PTL 1, resulting in enlargement of the size of the package.

Therefore, the present disclosure provides a new, improved semiconductor package that can be further reduced in size.

Solution to Problem

According to the present disclosure, provided is a semiconductor package including: a mounting substrate; a semiconductor chip having a smaller area than the mounting substrate and mounted on a main surface of the mounting substrate; a sealing glass facing the semiconductor chip and the mounting substrate, connected to the mounting substrate by a substrate connection part, and connected to the semiconductor chip by a chip connection part; and a connection wiring layer provided on a first surface of the sealing glass that faces the mounting substrate and the semiconductor chip, and electrically connected to the mounting substrate and the semiconductor chip via the substrate connection part and the chip connection part, wherein the mounting substrate, the semiconductor chip, and the sealing glass have approximately the same thermal expansion coefficient.

US 12,701,813 B2

3

Figure 7A:
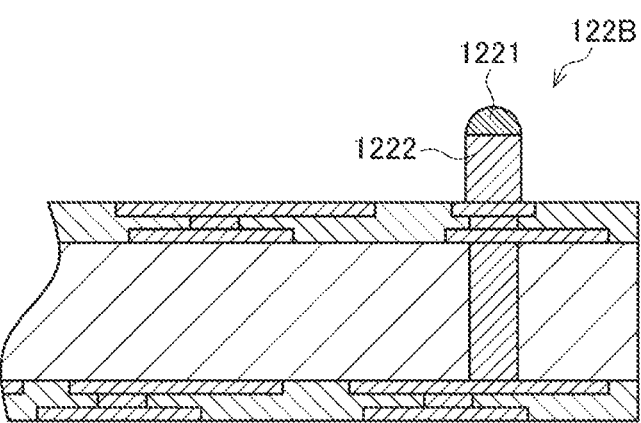
FIG. 7A is a vertical cross-sectional view extracting and showing the vicinity of a substrate connection part of a semiconductor package according to a first modification.
Figure 7B:
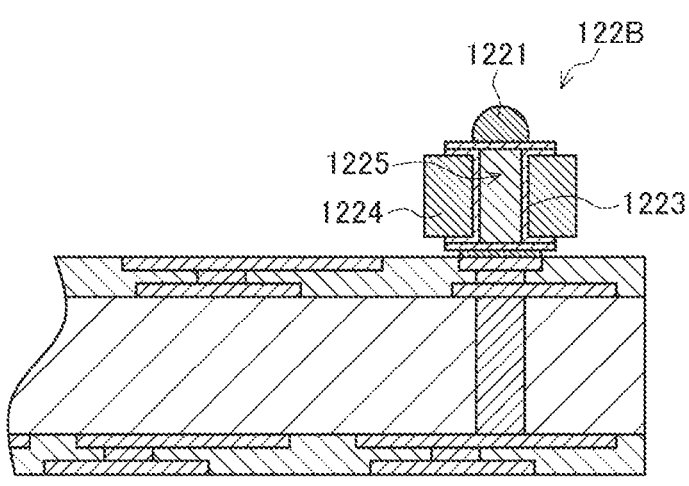
FIG. 7B is a vertical cross-sectional view extracting and showing the vicinity of the substrate connection part of the semiconductor package according to the first modification.
Figure 7C:
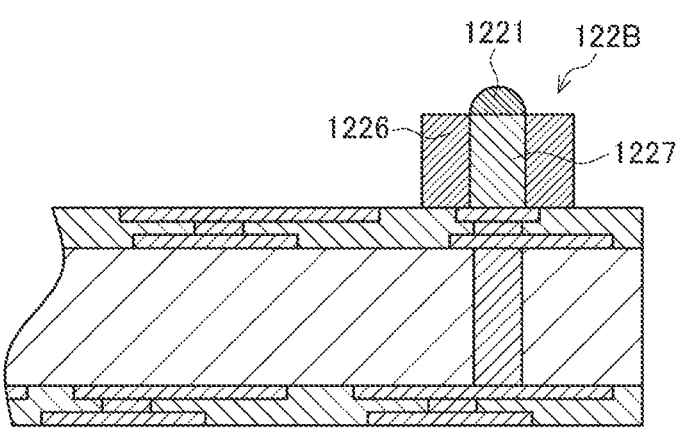
FIG. 7C is a vertical cross-sectional view extracting and showing the vicinity of the substrate connection part of the semiconductor package according to the first modification.
Figure 7D:
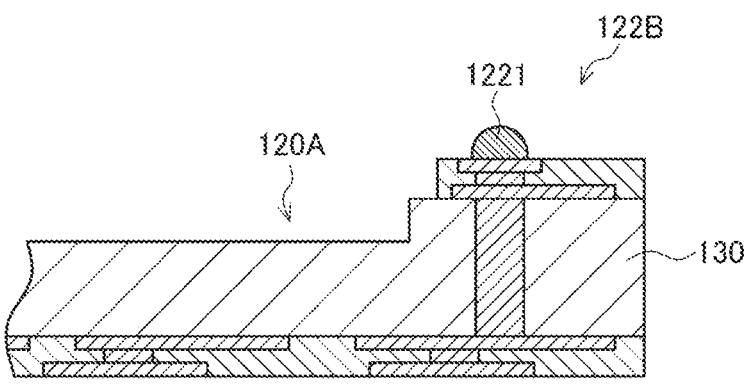

FIG. 7D is a vertical cross-sectional view extracting and showing the vicinity of the substrate connection part of the semiconductor package according to the first modification.

Figure 8A:
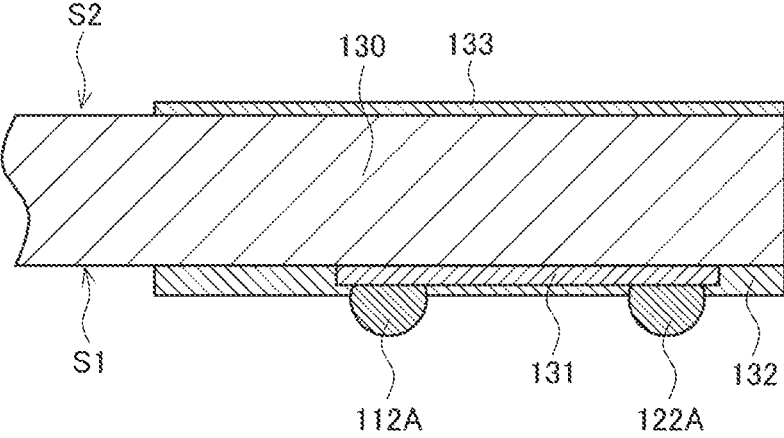

FIG. 8A is a vertical cross-sectional view extracting and showing the vicinity of a connection wiring layer of a semiconductor package according to a second modification.

Figure 8B:
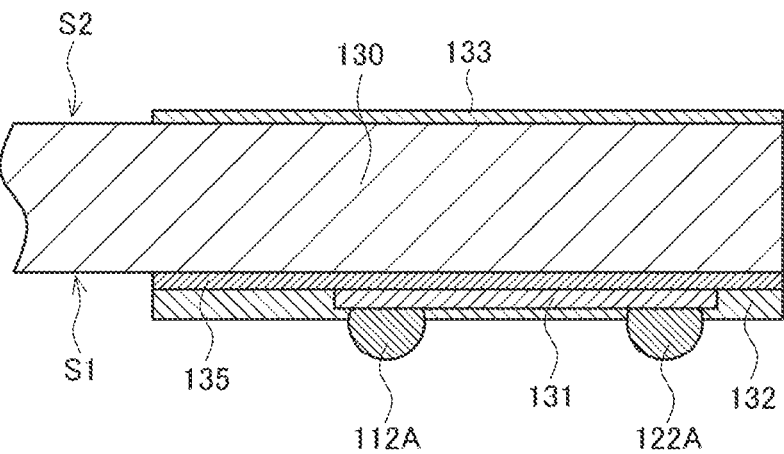

FIG. 8B is a vertical cross-sectional view extracting and showing the vicinity of the connection wiring layer of the semiconductor package according to the second modification.

Figure 8C:
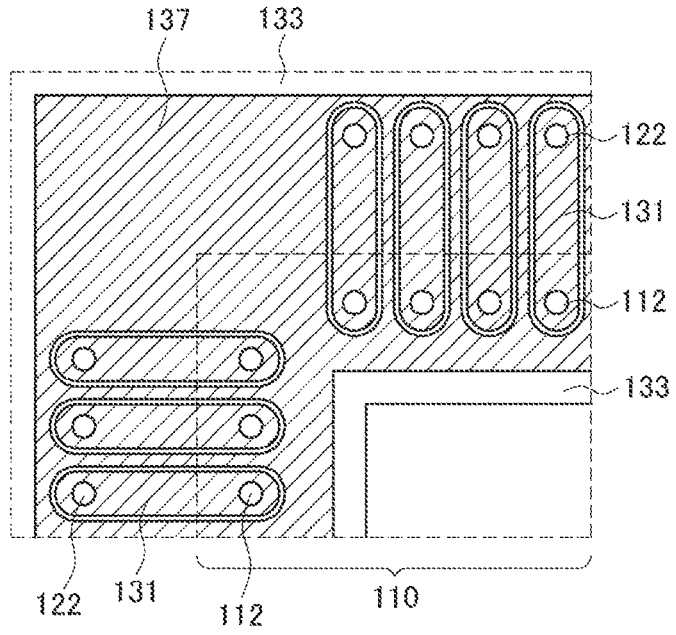

FIG. 8C is a plan view showing a planar arrangement of a substrate connection part and a chip connection part in the semiconductor package according to the second modification.

Figure 9:
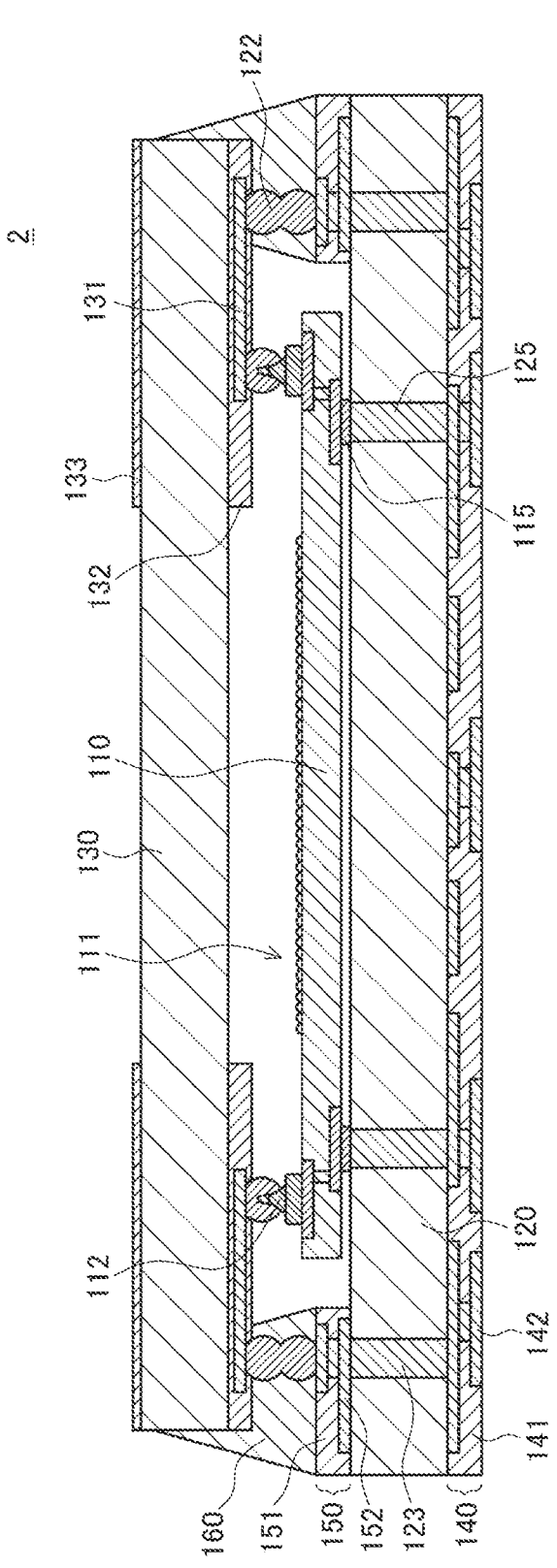

FIG. 9 is a vertical cross-sectional view showing a configuration of a semiconductor package according to a third modification.

DESCRIPTION OF EMBODIMENTS

Preferred embodiments of the present disclosure will be described in detail with reference to the accompanying figures below. Also, in the present specification and the figures, components having substantially the same functional configuration will be denoted by the same reference numerals, and thus repeated descriptions thereof will be omitted.

Figure 1:
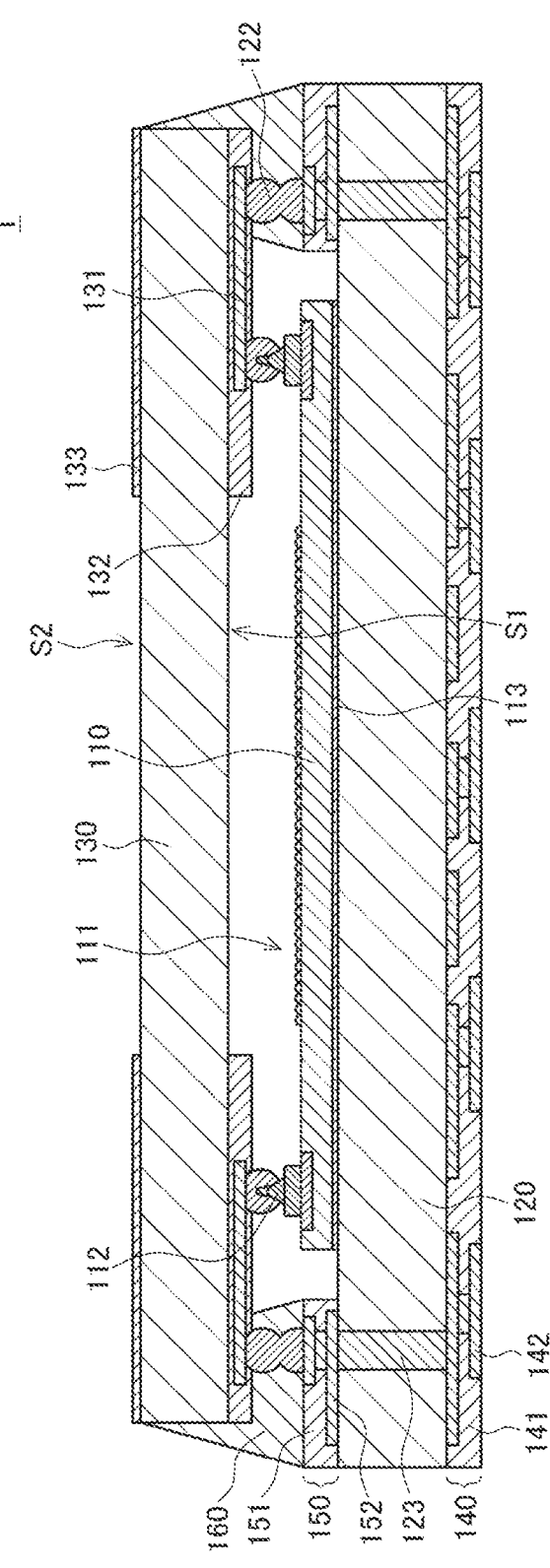
FIG. 1 is a vertical cross-sectional view showing a cross-sectional configuration of a semiconductor package according to an embodiment of the present disclosure.

Also, the descriptions will be given in the following order.
1. Configuration of semiconductor package
2. Method of manufacturing semiconductor package
2.1. Sealing glass
2.2. Semiconductor chip
2.3. Mounting substrate
2.4. Semiconductor package
3. Modifications
3.1. Modification of substrate connection part
3.2. Modification of sealing glass
3.3. Modification of mounting substrate
4. Conclusion 1. Configuration of Semiconductor Package First, a configuration example of a semiconductor package according to an embodiment of the present disclosure will be described with reference to FIG. 1. FIG. 1 is a vertical cross-sectional view showing a cross-sectional configuration of a semiconductor package 1 according to the present embodiment.

As shown in FIG. 1, the semiconductor package 1 includes a semiconductor chip 110, a mounting substrate 120, a front wiring layer 150, a back wiring layer 140, a through via 123, a sealing glass 130, a chip connection part 112, a substrate connection part 122, a connection wiring layer 131, and a sealing part 160.

The semiconductor chip 110 is mounted on a main surface of the mounting substrate 120 via a die bond layer 113. The die bond layer 113 is composed of, for example, a liquid adhesive, and allows the semiconductor chip 110 to be fixed to the mounting substrate 120 by mounting the semiconductor chip 110 on the mounting substrate 120 via the die bond layer 113 and thereafter thermally-treating the die bond layer 113.

The semiconductor chip 110 is a chip-shaped silicon (Si) substrate on which a semiconductor device is formed. For example, the semiconductor chip 110 is a chip on which an imaging element such as a CMOS (Complementary MOS) image sensor is formed. In this case, a pixel region 111 is provided at approximately the center of the semiconductor chip 110. The pixel region 111 has a plurality of pixels arranged in a matrix, the pixels generating signals corresponding to the received amounts of light incident through the sealing glass 130. Thus, the semiconductor chip 110 can generate a captured image according to the light received by the pixel region 111.

The mounting substrate 120 is a substrate provided to have an area greater than that of the semiconductor chip 110, and has the semiconductor chip 110 mounted on its main surface via the die bond layer 113. For example, the mounting substrate 120 may be a substrate having glass as a core material thereof.

The main surface of the mounting substrate 120 on which the semiconductor chip 110 is mounted is provided with the front wiring layer 150. The front wiring layer 150 is provided in an outer peripheral region of the mounting substrate 120, away from the semiconductor chip 110 mounted at approximately the center of the mounting substrate 120. The front wiring layer 150 includes wiring 152 composed of a conductive material such as copper (Cu) and an interlayer insulating layer 151 with insulation properties that electrically separates the wiring 152 layer by layer. The interlayer insulating layer 151 may be composed of an organic resin such as an epoxy-based resin or a polyimide-based resin, or may be composed of an inorganic oxynitride such as silicon dioxide ($SiO_2$), silicon nitride (SiN), or silicon oxynitride (SiON).

Furthermore, the back wiring layer 140 is provided on a surface opposite to the main surface of the mounting substrate 120 on which the front wiring layer 150 is provided. The back wiring layer 140 is provided over the entire surface of the mounting substrate 120. The back wiring layer 140 includes wiring 142 composed of a conductive material such as copper (Cu) and an interlayer insulating layer 141 with insulation properties that electrically separates the wiring 142 layer by layer. The interlayer insulating layer 141 may be composed of an organic resin such as an epoxy-based resin or a polyimide-based resin, or may be composed of an inorganic oxynitride such as silicon dioxide ($SiO_2$), silicon nitride (SiN), or silicon oxynitride (SiON).

The wiring 152 included in the front wiring layer 150 and the wiring 142 included in the back wiring layer 140 are electrically connected to each other by the through via 123 penetrating the mounting substrate 120. The through via 123 may be provided by, for example, embedding a conductive material such as copper (Cu) in a through hole penetrating the mounting substrate 120.

Data of the captured image generated by the semiconductor chip 110 are first transmitted to the wiring 152 included in the front wiring layer 150 of the mounting substrate 120 through the chip connection part 112, the connection wiring layer 131, and the substrate connection part 122. The data of the captured image are thereafter transmitted to the wiring 142 included in the back wiring layer 140 of the mounting substrate 120 through the through via 123. Thus, according to the semiconductor package 1, the data of the captured image generated by the semiconductor chip 110 can be output from the surface opposite to the main surface of the mounting substrate 120 on which the semiconductor chip 110 is mounted.

The sealing glass 130 is provided for protecting the semiconductor chip 110 from the external environment while transmitting light incident on the semiconductor chip 110. Specifically, the sealing glass 130 is provided facing the semiconductor chip 110 and the mounting substrate 120, is connected to the semiconductor chip 110 by the chip connection part 112, and is connected to the mounting substrate 120 by the substrate connection part 122. The sealing glass 130 may be composed of a glass substrate that has its characteristics such as light transmittance, light refractive index, and low alpha ray emission performance satisfying a desired condition. For example, the sealing glass 130 may be composed of a transparent glass substrate used in a liquid crystal display and the like. Therefore, the sealing glass 130 can allow external light to efficiently enter the pixel region 111 of the semiconductor chip 110.

A first surface S1 of the sealing glass 130 that faces the semiconductor chip 110 and the mounting substrate 120 is provided with the connection wiring layer 131. The connection wiring layer 131 can transmit the data of the captured image generated by the semiconductor chip 110 to the mounting substrate 120 via the chip connection part 112 and the substrate connection part 122. The connection wiring layer 131 may be composed of a conductive material such as copper (Cu).

Note that the connection wiring layer 131 may be provided so as to be in contact with the sealing glass 130, or may be provided so as not to be in contact with the sealing glass 130. When the connection wiring layer 131 and the sealing glass 130 are not in contact with each other, the connection wiring layer 131 may be provided on the first surface S1 of the sealing glass 130 via a first surface light shielding film 132.

The chip connection part 112 physically connects the sealing glass 130 and the semiconductor chip 110, and electrically connects the connection wiring layer 131 provided on the sealing glass 130 and the semiconductor chip 110. The chip connection part 112 may be composed of, for example, an Au stud bump provided in the semiconductor chip 110, an electrode pad provided in the connection wiring layer 131, and a solder ball connecting the Au stud bump and the electrode pad.

The substrate connection part 122 physically connects the sealing glass 130 and the mounting substrate 120, and electrically connects the connection wiring layer 131 provided on the sealing glass 130 and the mounting substrate 120 (more specifically, the wiring 152 of the front wiring layer 150). The substrate connection part 122 may be composed of, for example, a solder-plated bump provided in the mounting substrate 120, an electrode pad provided in the connection wiring layer 131, and a solder ball connecting the solder-plated bump and the electrode pad.

The chip connection part 112 and the substrate connection part 122 may be connected in various ways such as Au—Au connection, solder-solder connection, Au-solder connection, or NCF/NCP connection. However, the chip connection part 112 and the substrate connection part 122 may be connected by a method including solder, in order to provide a large process margin of a manufacturing process. Thus, even when a tolerance is present between surface positions of the semiconductor chip 110 and the mounting substrate 120, the chip connection part 112 and the substrate connection part 122 can connect the sealing glass 130 to the semiconductor chip 110 and the mounting substrate 120 more flexibly. In addition, in order to further reduce the pitch between chip connection parts 112 adjacent to each other or between substrate connection parts 122 adjacent to each other, the chip connection parts 112 and the substrate connection parts 122 may be configured in such a manner that a solder-plated bump is formed in the connection wiring layer 131.

Figure 2:
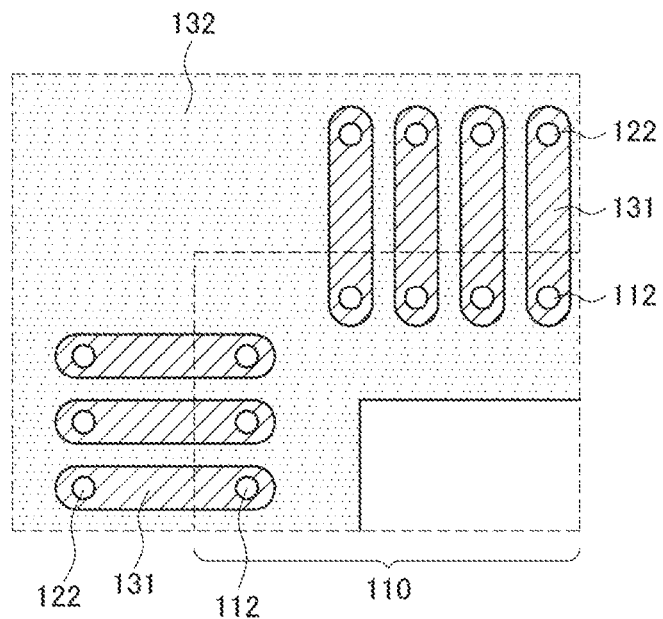
FIG. 2 is a plan view showing a planar arrangement of a substrate connection part and a chip connection part.

A planar arrangement of the substrate connection part 122 and the chip connection part 112 is now described with reference to FIG. 2. FIG. 2 is a plan view showing a planar arrangement of the substrate connection part 122 and the chip connection part 112.

As shown in FIG. 2, the chip connection part 112 may be provided in an outer peripheral region of the semiconductor chip 110. Specifically, the pixel region 111 in which a plurality of pixels are arranged in a matrix may be provided at approximately the center of the semiconductor chip 110, and the chip connection part 112 may be provided in the outer peripheral region of the semiconductor chip 110 so as to surround the pixel region 111. On the other hand, the substrate connection part 122 may be provided in a region surrounding the semiconductor chip 110 of the mounting substrate 120 so as to face the chip connection part 112. Thus, the connection wiring layer 131 can electrically connect the chip connection part 112 and the substrate connection part 122 by a linear shortest path.

Note that the chip connection parts 112 adjacent to each other or the substrate connection parts 122 adjacent to each other may have the same pitch or different pitches. Also, the wiring width of the connection wiring layer 131 may be the same or may vary depending on the place where the connection wiring layer 131 is provided.

The sealing glass 130 may be further provided with the first surface light shielding film 132 and a second surface light shielding film 133.

The first surface light shielding film 132 is provided in, for example, the first surface S1 of the sealing glass 130 that faces the semiconductor chip 110 and the mounting substrate 120. The first surface light shielding film 132 is provided in a region not superimposed on the pixel region 111 of the semiconductor chip 110, and can prevent the occurrence of stray light by blocking light incident on a region other than the pixel region 111. The first surface light shielding film 132 may be composed of, for example, a rein containing a black pigment (e.g., black solder resist, etc.).

Note that the first surface light shielding film 132 may be provided between the connection wiring layer 131 and the sealing glass 130 or may be provided so as to contain the connection wiring layer 131. When the first surface light shielding film 132 contains the connection wiring layer 131, the first surface light shielding film 132 is provided with an opening for exposing the connection wiring layer 131 in order to connect the chip connection part 112 and the substrate connection part 122 to the connection wiring layer 131.

The second surface light shielding film 133 is provided in, for example, a second surface S2 of the sealing glass 130 that is opposite to the first surface S1. The second surface light shielding film 133 is provided in a region not superimposed on the pixel region 111 of the semiconductor chip 110, and can prevent the occurrence of stray light by blocking light incident on a region other than the pixel region 111. Since the second surface light shielding film 133 is provided on the second surface S2 which is a light incident surface, the second surface light shielding film 133 can prevent the occurrence of stray light more efficiently than the first surface light shielding film 132. The second surface light shielding film 133 may be composed of, for example, a rein containing a black pigment (e.g., black solder resist, etc.).

The first surface light shielding film 132 and the second surface light shielding film 133 may be provided in the same region or different regions.

The sealing part 160 is provided in a region provided with the substrate connection part 122, so as to incorporate the substrate connection part 122. The sealing part 160 seals the internal space composed of the sealing glass 130 and the mounting substrate 120, by attaching the sealing glass 130 and the mounting substrate 120 to each other at the respective outer peripheral regions thereof. The sealing part 160 may be composed of an organic resin such as an epoxy-based resin. Also, the organic resin constituting the sealing part 160 may include a filler, an additive, or the like.

The sealing part 160 may be provided in a space sandwiched between the front wiring layer 150 of the mounting substrate 120 and the sealing glass 130. Specifically, the sealing part 160 may be configured by filling the space sandwiched between the front wiring layer 150 and the sealing glass 130 with an organic resin such as an epoxy-based resin. In this case, the sealing part 160 can retain the filled organic resin in the space sandwiched between the front wiring layer 150 and the sealing glass 130, by surface tension. Therefore, the sealing part 160 can be configured in such a manner that the semiconductor chip 110, located away from the front wiring layer 150, does not come into contact with the filled organic resin. Accordingly, since the sealing part 160 can prevent the contraction stress occurring due to curing of the organic resin from acting on the semiconductor chip 110, warpage of the semiconductor chip 110 due to the sealing part 160 can be prevented from occurring.

In the semiconductor package 1 according to the present embodiment described above, the semiconductor chip 110, the mounting substrate 120, and the sealing glass 130 are configured to have approximately the same thermal expansion coefficient. Therefore, in the semiconductor package 1 according to the present embodiment, distortion that occurs between the semiconductor chip 110, the mounting substrate 120, and the sealing glass 130 when temperature cycling is performed can be further reduced.

The distortion occurring between the semiconductor chip 110, the mounting substrate 120, and the sealing glass 130 causes cracking in the substrate connection part 122 and the chip connection part 112, contributing to a decrease in connection reliability. Thus, typically the connection reliability of the substrate connection part 122 and the chip connection part 112 is maintained by increasing the sizes of the substrate connection part 122 and the chip connection part 112 to reduce the ratio of the distortion amounts to the sizes. However, increasing the size of the substrate connection part 122 in particular leads to an expansion of the outer peripheral region of the mounting substrate 120 where the substrate connection part 122 is provided, resulting in an expansion of the size of the semiconductor package 1.

In the semiconductor package 1 according to the present embodiment, since distortion occurring between the semiconductor chip 110, the mounting substrate 120, and the sealing glass 130 can be reduced, the connection reliability can be maintained even with a smaller substrate connection part 122. Accordingly, in the semiconductor package 1, since the outer peripheral region of the mounting substrate 120 where the substrate connection part 122 is provided can be reduced, the size of the package can be reduced. In addition, in the semiconductor package 1 according to the present embodiment, making the size of the substrate connection part 122 smaller can lead to a more reduced parasitic capacitance of the substrate connection part 122 and suppression of impedance mismatch between the connection wiring layer 131 and the wiring 152 included in the front wiring layer 150.

Moreover, in the semiconductor package 1 according to the present embodiment, the substrate connection part 122 and the chip connection part 112 may be provided at approximately the same height in the mounting substrate 120 and the semiconductor chip 110 respectively. In this case, since the distance between the wiring 152 included in the front wiring layer 150 and the connection wiring layer 131 becomes approximately the same as the distance between the semiconductor chip 110 and the connection wiring layer 131, the substrate connection part 122 and the chip connection part 112 are provided at approximately the same height. As a result, for the height of the substrate connection part 122 to be adjusted in relation to the connection wiring layer 131 or the sealing glass 130, the size of the substrate connection part 122 does not need to be excessively large to keep its connection reliability. Thus, since the semiconductor package 1 can be provided with the substrate connection part 122 of an appropriate size that takes the connection reliability into consideration, the size of the package can be further reduced.

Further, in the semiconductor package 1 according to the present embodiment, the sealing part 160 may be composed of a functional resin in place of the organic resin described above such as an epoxy-based resin. As described above, in the semiconductor package 1 according to the present embodiment, since the semiconductor chip 110, the mounting substrate 120, and the sealing glass 130 have approximately the same thermal expansion coefficient, the stress applied to the sealing part 160 becomes smaller. Therefore, the sealing part 160 may be composed of a resin that puts an emphasis on functionality over mechanical characteristics.

For example, the sealing part 160 may be composed of a resin having light-blocking effects. Examples of the resin with light-blocking effects include an organic resin having a black pigment mixed in. In such a case, the sealing part 160 is provided so as to cover up to a side surface of the sealing glass 130, thereby preventing the entry of external light from the side surface of the sealing glass 130 to the semiconductor package 1. Since the sealing part 160 can securely prevent stray light entering from the side surface of the semiconductor package 1, the occurrence of a flare or ghost in the captured image generated by the semiconductor chip 110 can be inhibited.

Further, for example, the sealing part 160 can be composed of a resin with air permeability. Examples of the resin with air permeability include a porous resin such as a foamable resin. In this case, the sealing part 160 can allow the passage of air and the like while preventing dust or moisture from entering from the outside into the internal space composed of the sealing glass 130 and the mounting substrate 120. Consequently, by letting the outside and the air in and out, the sealing part 160 can prevent the air of the internal space composed of the sealing glass 130 and the mounting substrate 120 from expanding or shrinking when the temperature or outside pressure changes, or prevent the occurrence of condensation. Therefore, the sealing part 160 can improve the reliability of the semiconductor package 1 for changes in temperature and humidity.

Note that in the semiconductor package 1 according to the present embodiment, thermal expansion coefficients of the semiconductor chip 110, the mounting substrate 120, and the sealing glass 130 respectively may be completely the same or approximately the same (that is, with a certain level of allowable tolerance).

For example, the thermal expansion coefficients of the semiconductor chip 110, the mounting substrate 120, and the sealing glass 130 respectively may be approximately the same, with an allowable tolerance of ±5 ppm/K or less. More preferably, the thermal expansion coefficients of the semiconductor chip 110, the mounting substrate 120, and the sealing glass 130 respectively may be approximately the same, with an allowable tolerance of ±2 ppm/K or less.

Specifically, in a case where the semiconductor chip 110 is composed of silicon (Si) as a base material, the mounting substrate 120 may be composed of a glass core substrate having a thermal expansion coefficient of ±5 ppm/K or less with respect to Si. Furthermore, the sealing glass 130 may be a glass backing material having a thermal expansion coefficient of ±5 ppm/K or less with respect to Si. Note that the glass contained as a core material in the mounting substrate 120 and the glass constituting the sealing glass 130 may be identical with each other or different from each other.

The allowable tolerance among the thermal expansion coefficients of the semiconductor chip 110, the mounting substrate 120, and the sealing glass 130 can vary depending on the sizes of the semiconductor chip 110 and the mounting substrate 120, a tolerance for warpage of the semiconductor chip 110 and the mounting substrate 120, the sizes of the substrate connection part 122 and the chip connection part 112, a temperature guarantee range when the semiconductor package 1 is used, the degree of performance or reliability required for the semiconductor package 1, and the like. Thus, the allowable tolerance of ±5 ppm/K or less or ±2 ppm/K or less described above is merely an example and is not intended to limit the technique according to the present disclosure.

2. Method of Manufacturing Semiconductor Package

Next, a method of manufacturing the semiconductor package 1 according to the present embodiment will be described with reference to FIGS. 3A to 6C.

(2.1. Sealing Glass)

First, a method of manufacturing the sealing glass 130 constituting the semiconductor package 1 is described with reference to FIGS. 3A to 3E. FIGS. 3A to 3E are each a vertical cross-sectional view for explaining each step of the method of manufacturing the sealing glass 130.

Figure 3A:
FIG. 3A is a vertical cross-sectional view for explaining a step of a method of manufacturing sealing glass.

As shown in FIG. 3A, first, a glass board material 130A is prepared as a board material of the sealing glass 130. The glass board material 130A is composed of a glass material that has its characteristics such as light transmittance, light refractive index, and low alpha ray emission performance satisfying a desired condition as the sealing glass 130, and has approximately the same thermal expansion coefficient as the semiconductor chip 110. For example, the glass board material 130A may be composed of a glass material having a thermal expansion coefficient of ±5 ppm/K or less or preferably ±2 ppm/K or less with respect to Si which is a base material of the semiconductor chip 110.

In addition, a dielectric multilayer with a reflection prevention function or a wavelength selection function may be formed on one side or both sides of the glass board material 130A. Thus, since the sealing glass 130 can prevent incident light from reflecting or selectively absorb or reflect incident light of a predetermined wavelength band, external light can efficiently be made incident on the semiconductor chip 110.

Figure 3B:
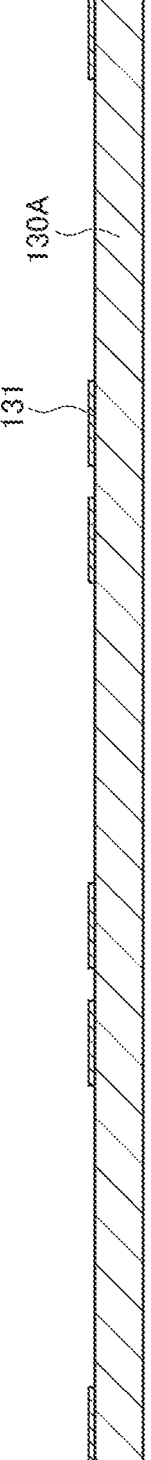
FIG. 3B is a vertical cross-sectional view for explaining a step of a method of manufacturing sealing glass.

Next, as shown in FIG. 3B, the connection wiring layer 131 is formed on the glass board material 130A. The connection wiring layer 131 may be formed of copper (Cu) having low electrical resistivity by using various methods such as plating, sputtering, or printing.

The connection wiring layer 131 may be formed directly on the glass board material 130A or may be formed on the glass board material 130A via the first surface light shielding film 132 provided in advance in a wiring formation region.

Thus, by providing the first surface light shielding film 132 between the connection wiring layer 131 and the glass board material 130A, the adhesion can be improved and stress generated by thermal expansion can be reduced.

Figure 3C:
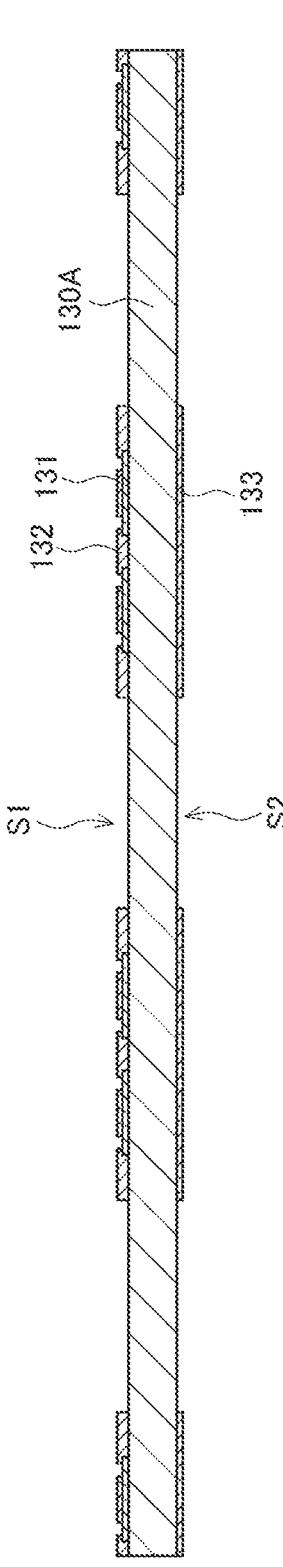
FIG. 3C is a vertical cross-sectional view for explaining a step of a method of manufacturing sealing glass.

Next, as shown in FIG. 3C, the first surface light shielding film 132 is formed on the first surface S1 of the glass board material 130A on which the connection wiring layer 131 is formed, so as to cover the connection wiring layer 131, and then the second surface light shielding film 133 is formed on the second surface S2 opposite to the first surface S1. The first surface light shielding film 132 and the second surface light shielding film 133 may be formed by black solder resist having light-blocking effects, low reflectivity, insulation, and low outgassing characteristics by using various methods such as printing or lithography.

Further, in the first surface light shielding film 132 and the second surface light shielding film 133, an opening may be provided in a region superimposed on the pixel region 111 of the semiconductor chip 110. Also, in the first surface light shielding film 132, an opening is provided in a region where a glass-side contact point 112A and a glass-side contact point 122A in a rear stage, and the connection wiring layer 131 is exposed through the opening.

Figure 3D:
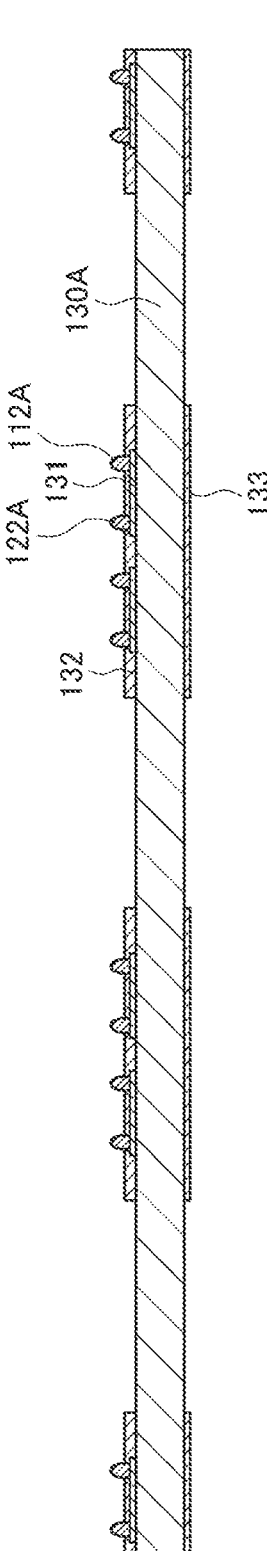
FIG. 3D is a vertical cross-sectional view for explaining a step of a method of manufacturing sealing glass.

Next, as shown in FIG. 3D, the glass-side contact point 112A and the glass-side contact point 122A are formed in the opening that is provided in the first surface light shielding film 132 so as to expose the connection wiring layer 131. The glass-side contact point 112A is a bump constituting a part of the chip connection part 112, and the glass-side contact point 122A is a bump constituting a part of the substrate connection part 122. The glass-side contact point 112A and the glass-side contact point 122A may be, for example, solder-plated bumps.

Figure 3E:
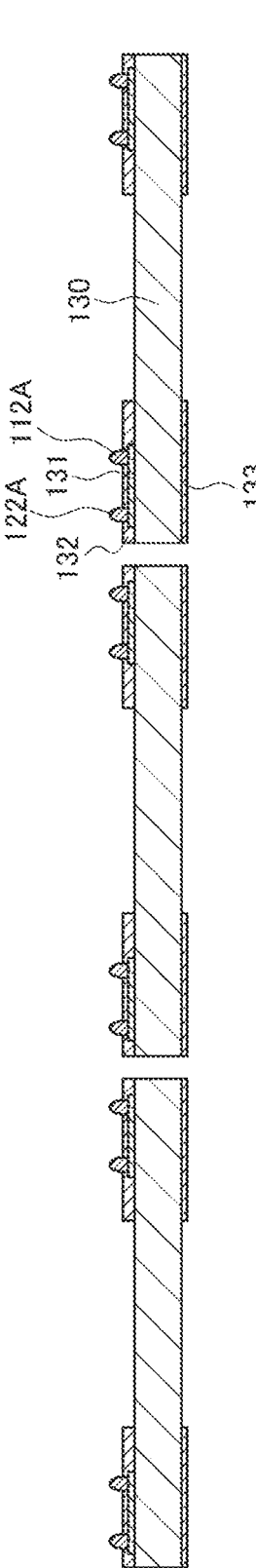
FIG. 3E is a vertical cross-sectional view for explaining a step of a method of manufacturing sealing glass.

Thereafter, as shown in FIG. 3E, the sealing glass 130 is formed by cutting the glass board material 130A into pieces corresponding to the size of the semiconductor package 1. The glass board material 130A can be cut using various methods such as blade dicing, laser dicing, or Wheel Scribe & Break.

(2.2. Semiconductor Chip)

Figure 4A:
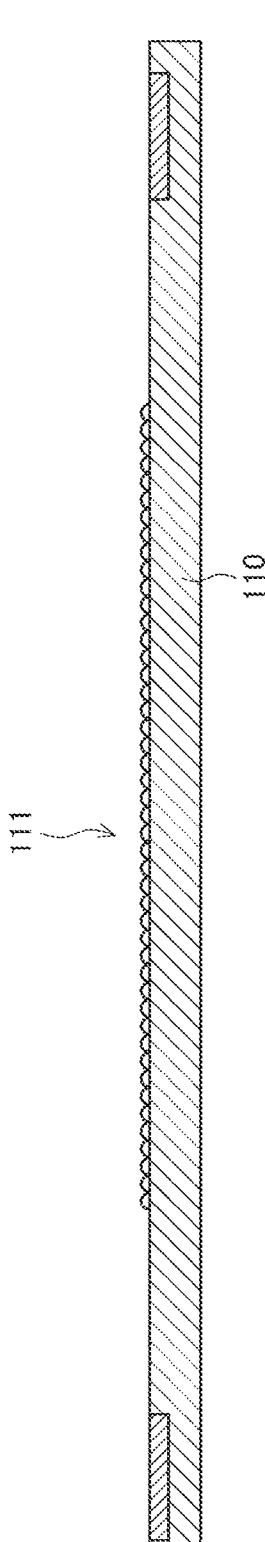
FIG. 4A is a vertical cross-sectional view for explaining a step of a method of manufacturing a semiconductor chip.
Figure 4B:
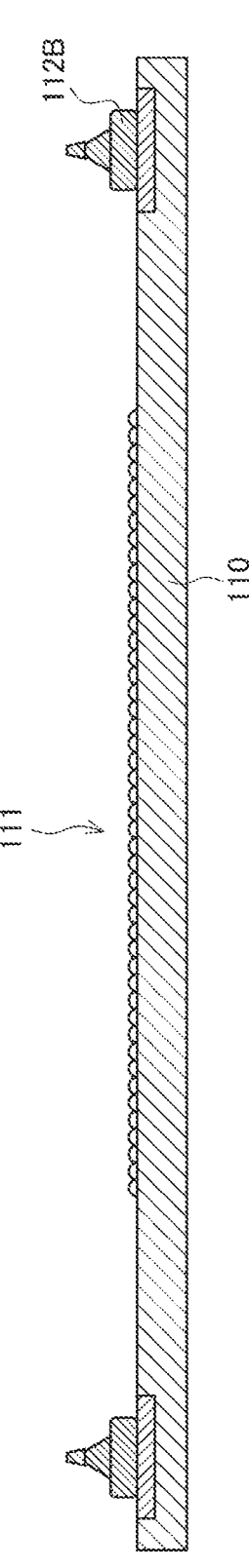
FIG. 4B is a vertical cross-sectional view for explaining a step of a method of manufacturing a semiconductor chip.

Next, the method of manufacturing the semiconductor chip 110 constituting the semiconductor package 1 will be described with reference to FIGS. 4A and 4B. FIGS. 4A and 4B are each a vertical cross-sectional view for explaining each step of the method of manufacturing the semiconductor chip 110.

As shown in FIG. 4A, an image sensor chip having the pixel region 111 is prepared as the semiconductor chip 110. As shown in FIG. 4B, a chip-side contact point 112B is formed in an electrode pad of the semiconductor chip 110. The chip-side contact point 112B may be an Au stud bump for Au-solder connection.

(2.3. Mounting Substrate)

Figure 5A:
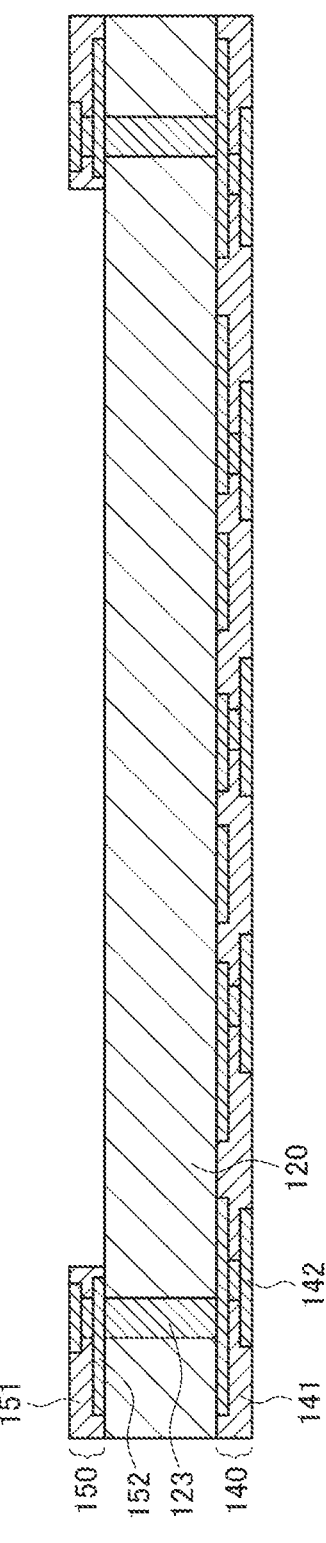
FIG. 5A is a vertical cross-sectional view for explaining a step of a method of manufacturing a mounting substrate.
Figure 5B:
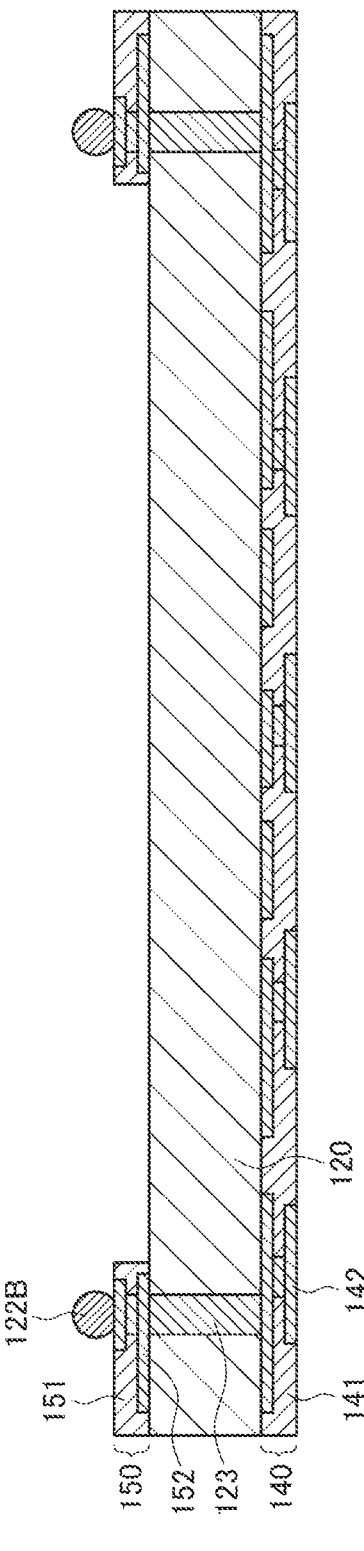
FIG. 5B is a vertical cross-sectional view for explaining a step of a method of manufacturing a mounting substrate.

Next, a method of manufacturing the mounting substrate 120 constituting the semiconductor package 1 will be described with reference to FIGS. 5A and 5B. FIGS. 5A and 5B are each a vertical cross-sectional view for explaining each step of the method of manufacturing the mounting substrate 120.

As shown in FIG. 5A, the mounting substrate 120 having glass as a core material is prepared. The mounting substrate 120 may be a substrate having, as a core material, glass having approximately the same thermal expansion coefficient as the semiconductor chip 110. The main surface of the mounting substrate 120 on which the semiconductor chip 110 is mounted is provided with the front wiring layer 150 at an outer peripheral region. Also, the back wiring layer 140 is provided on the entire surface opposite to the main surface of the mounting substrate 120 on which the semiconductor chip 110 is provided. In addition, the wiring 152 of the front wiring layer 150 and the wiring 142 of the back wiring layer 140 are electrically connected to each other by the through via 123 penetrating the mounting substrate 120. As shown in FIG. 5B, a substrate-side contact point 122B is formed in the wiring 152 of the front wiring layer 150. The substrate-side contact point 122B may be a solder-plated bump for solder-solder connection.

(2.4. Semiconductor Package)

Figure 6A:
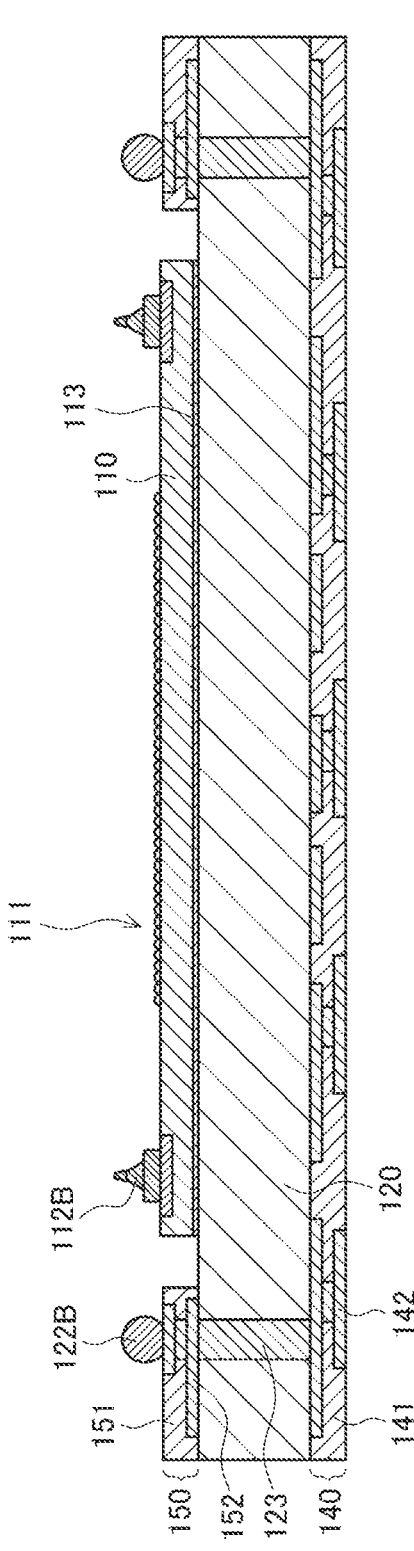
FIG. 6A is a vertical cross-sectional view for explaining a step of a method of manufacturing a semiconductor package.
Figure 6B:
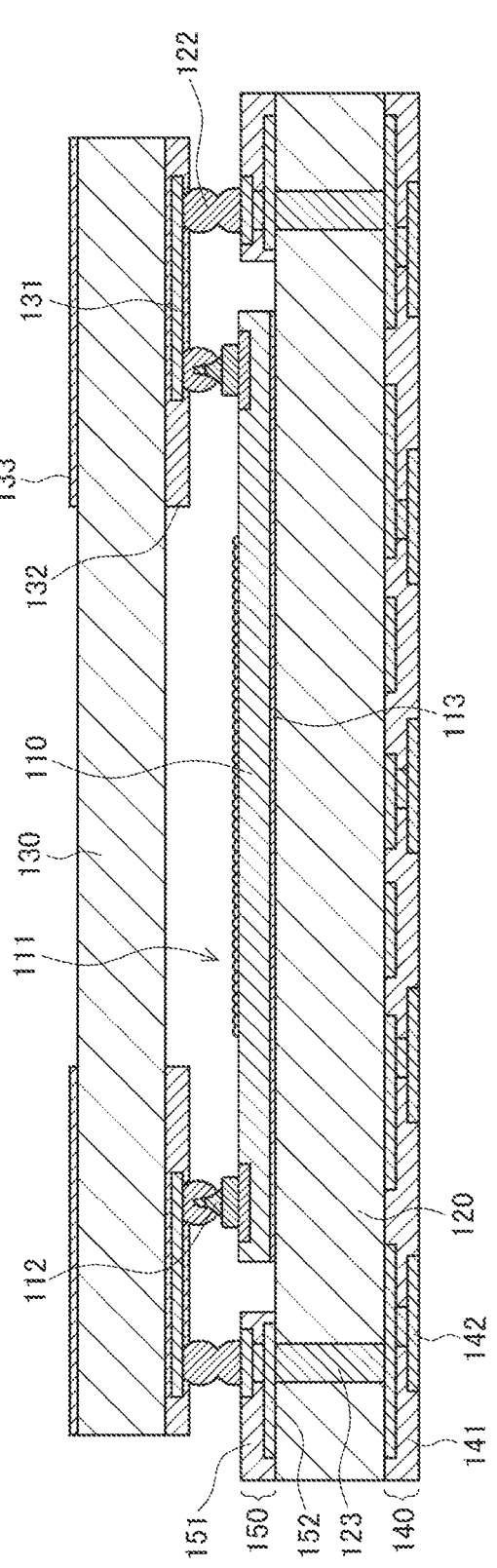
FIG. 6B is a vertical cross-sectional view for explaining a step of a method of manufacturing a semiconductor package.
Figure 6C:
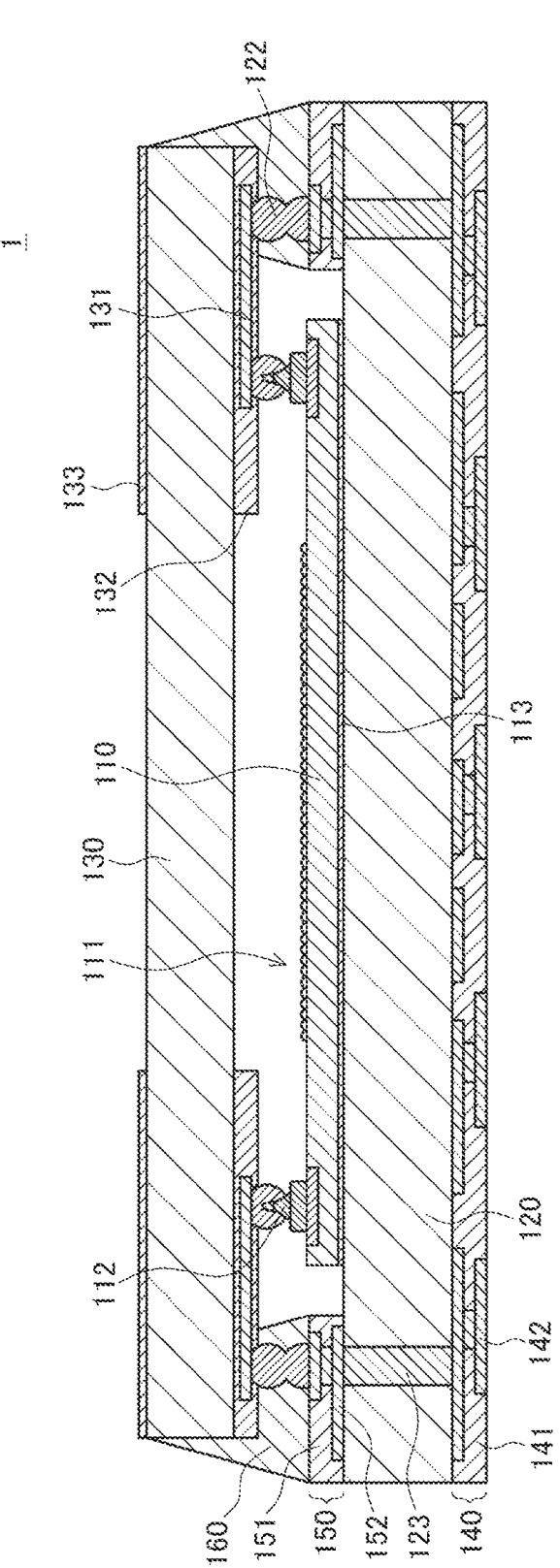
FIG. 6C is a vertical cross-sectional view for explaining a step of a method of manufacturing a semiconductor package.

Furthermore, the method of manufacturing the semiconductor package 1 will be described with reference to FIGS. 6A to 6C. FIGS. 6A to 6C are each a vertical cross-sectional view for explaining each step of the method of manufacturing the semiconductor package 1.

As shown in FIG. 6A, the semiconductor chip 110 manufactured by the step shown in FIG. 4B is mounted on the mounting substrate 120 manufactured by the step shown in FIG. 5B. Specifically, the semiconductor chip 110 may be fixed onto the mounting substrate 120 by the die bond layer 113 that is formed by applying a die bond material onto the mounting substrate 120. In addition, the semiconductor chip 110 may be fixed onto the mounting substrate 120 by a DAF (Die Attached Film) that is attached to a chip back surface as the die bond layer 113.

Note that in the semiconductor chip 110 and the mounting substrate 120 shown in FIG. 6A, the chip-side contact point 112B formed in the semiconductor chip 110 and the substrate-side contact point 122B formed in the front wiring layer 150 may be provided on approximately the same level. In this manner, in the semiconductor package 1, the semiconductor chip 110 and the mounting substrate 120 can be joined to the sealing glass 130 more efficiently.

Next, as shown in FIG. 6B, the sealing glass 130 manufactured in the step shown in FIG. 3E is joined to the semiconductor chip 110 and the mounting substrate 120 in such a manner that the chip-side contact point 112B and the substrate-side contact point 122B face the glass-side contact point 112A and the glass-side contact point 122A. Thus, the chip connection part 112 is formed by joining the chip-side contact point 112B formed in the semiconductor chip 110 and the glass-side contact point 112A formed in the sealing glass 130. Similarly, the substrate connection part 122 is formed by joining the substrate-side contact point 122B formed in the front wiring layer 150 and the glass-side contact point 122A formed in the sealing glass 130. The joining between the chip-side contact point 112B and the glass-side contact point 112A and the joining between the substrate-side contact point 122B and the glass-side contact point 122A may be performed by means of local reflow with a flip chip bonder.

Thereafter, as shown in FIG. 6C, the sealing part 160 is formed by applying an organic resin such as an epoxy-based resin to the space held between the front wiring layer 150 of the mounting substrate 120 and the sealing glass 130. The sealing part 160 can protect the semiconductor chip 110 from the external environment by sealing the semiconductor chip 110 inside of the space formed between the mounting substrate 120 and the sealing glass 130.

The sealing part 160 may be formed by applying an organic resin between the front wiring layer 150 and the sealing glass 130 by means of, for example, a dispenser. In this case, since the mounting substrate 120 and the semiconductor chip 110 are separated from each other, the organic resin applied between the front wiring layer 150 and the sealing glass 130 remains between the front wiring layer

150 and the sealing glass 130 by surface tension and does not reach the semiconductor chip 110. This allows the sealing part 160 to prevent warpage of the semiconductor chip 110 by the adhesion of the organic resin to the semiconductor chip 110.

According to the steps described above, the semiconductor package 1 according to the present embodiment can be manufactured.

3. Modifications (3.1. Modifications of Substrate Connection Part)

Subsequently, a first modification of the semiconductor package 1 according to the present embodiment will be described with reference to FIGS. 7A to 7D. FIGS. 7A to 7D are each a vertical cross-sectional view extracting and showing the vicinity of the substrate connection part 122 of the semiconductor package 1 according to the first modification.

In the semiconductor package 1 described above, the substrate-side contact point 122B of the substrate connection part 122 and the chip-side contact point 112B of the chip connection part 112 can be provided on approximately the same level. For example, the level of the substrate-side contact point 122B of the substrate connection part 122 and the chip-side contact point 112B of the chip connection part 112 can be made approximately equivalent to each other by adjusting the thickness of the front wiring layer 150 or the thickness of the semiconductor chip 110.

The semiconductor package 1 according to the first modification is a modification in which, aside from the above description, the level of the substrate-side contact point 122B of the substrate connection part 122 by changing the configuration of the substrate-side contact point 122B of the substrate connection part 122. Thus, in the semiconductor package 1 according to the first modification, since the front wiring layer 150 can be formed over the entire surface of the mounting substrate 120, the restriction of the layout of the wiring 152 included in the front wiring layer 150 can be reduced.

As shown in FIG. 7A, the substrate-side contact point 122B may be composed of pillar part 1222 formed in a cylindrical shape on the front wiring layer 150 and a solder part 1221 formed on an upper surface of the pillar part 1222. The pillar part 1222 can be formed by, for example, forming a seed layer on the front wiring layer 150, thereafter applying a resist for opening a region for forming the pillar part 1222, and growing copper (Cu) or the like in the opening of the resist by means of electrolyte plating. The substrate-side contact point 122B can form an electric contact point of the wiring 152 included in the front wiring layer 150 via the pillar part 1222 and the solder part 1221. In the example shown in FIG. 7A, the semiconductor package 1 can adjust the level of the substrate-side contact point 122B by adjusting the level of the pillar part 1222.

As shown in FIG. 7B, the substrate-side contact point 122B may be composed of a printed board part 1224 provided on the front wiring layer 150, an opening part 1225 penetrating the printed board part 1224, a plated part 1223 provided on an inner wall of the opening part 1225, and the solder part 1221 formed on the plated part 1223. The printed board part 1224 is a member that is provided in a size corresponding to one side of the outer peripheral region of the mounting substrate 120, wherein a through hole composed of the opening part 1225 and the plated part 1223 is formed. The printed board part 1224 is mounted on the front wiring layer 150 by a method similar to that for a front mounting component. Accordingly, the substrate-side contact point 122B can form an electric contact point of the wiring 152 included in the front wiring layer 150 via the plated part 1223 and the solder part 1221. According to the example shown in FIG. 7B, the semiconductor package 1 can adjust the level of the substrate-side contact point 122B by adjusting the thickness of the printed board part 1224.

As shown in FIG. 7C, the substrate-side contact point 122B may be composed of a mold part 1226 formed on the front wiring layer 150, a via part 1227 penetrating the mold part 1226, and the solder part 1221 formed on an upper surface of the via part 1227. The mold part 1226 is an insulating member provided on the front wiring layer 150 so as to correspond to the outer peripheral region of the mounting substrate 120. The via part 1227 is formed by filling an opening, which is formed in the mold part 1226 by using a laser beam or the like, with various conductive materials such as copper (Cu) and solder by means of various methods. Therefore, the substrate-side contact point 122B can form an electric contact point of the wiring 152 included in the front wiring layer 150 via the via part 1227 and the solder part 1221. According to the example shown in FIG. 7C, the semiconductor package 1 can adjust the level of the substrate-side contact point 122B by adjusting the levels of the mold part 1226 and the via part 1227.

As shown in FIG. 7D, the substrate-side contact point 122B may be composed of the solder part 1221 provided on the front wiring layer 150. On the other hand, the region at approximately the center of the mounting substrate 120 where the semiconductor chip 110 is mounted may have a recess structure 120A obtained by recessing the surface position of the mounting substrate 120. The recess structure 120A of the mounting substrate 120 can be formed by, for example, protecting a region other than the region where the recess structure 120A is formed, with a resist or the like, and thereafter performing wet etching on the mounting substrate 120 using a liquid medicine containing mainly hydrofluoric acid (HF). According to the example shown in FIG. 7D, the semiconductor package 1 can adjust the difference between the level of the chip-side contact point 112B provided in the semiconductor chip 110 and the level of the substrate-side contact point 122B by adjusting the depth of the recess structure 120A formed in the mounting substrate 120.

(3.2. Modification of Sealing Glass)

Next, a second modification of the semiconductor package 1 according to the present embodiment will be described with reference to FIGS. 8A to 8C. FIGS. 8A and 8B are each a vertical cross-sectional view extracting and showing the vicinity of the connection wiring layer 131 of the semiconductor package 1 according to the second modification. FIG. 8C is a plan view showing a planar arrangement of the substrate connection part 122 and the chip connection part 112 in the semiconductor package 1 according to the second modification. The semiconductor package 1 according to the second modification is a modification of the configuration on the first surface S1 side of the sealing glass 130.

As shown in FIG. 8A, the connection wiring layer 131 may be provided on the first surface S1 of the sealing glass 130 so as to be in contact with the sealing glass 130. When there is sufficient adhesion reliability between the connection wiring layer 131 and the sealing glass 130, the manufacturing process can be further simplified and the manufacturing cost can be further reduced by directly forming the connection wiring layer 131 on the sealing glass 130.

As shown in FIG. 8B, the connection wiring layer 131 may be provided on the first surface S1 of the sealing glass 130 via a stress relief layer 135. The stress relief layer 135 is a layer provided for the purpose of relieving stress that is generated between the connection wiring layer 131 and the sealing glass 130 due to thermal expansion or improving the adhesion between the connection wiring layer 131 and the sealing glass 130. The stress relief layer 135 may be composed of, for example, an organic resin with low Young's modulus, such as an epoxy-based resin. The stress relief layer 135 may also be composed of a material having a thermal expansion coefficient between the thermal expansion coefficient of the connection wiring layer 131 and the thermal expansion coefficient of the sealing glass 130.

The stress relief layer 135 is favorably provided especially when the connection wiring layer 131 is made thick in order to lower the electrical resistance of the connection wiring layer 131 or when the connection wiring layer 131 is made of a material having a thermal expansion coefficient much different from that of the sealing glass 130. Even in such a case as well, the stress relief layer 135 can maintain the adhesion reliability between the connection wiring layer 131 and the sealing glass 130.

Note that the stress relief layer 135 may be composed of an organic resin having a black pigment mixed in. In such a case, the stress relief layer 135 is provided so as to have light-blocking effects and therefore can prevent the reflection of light on the back surface of the connection wiring layer 131. In such a case, the stress relief layer 135 can further suppress stray light entering into the semiconductor chip 110.

Also, in a case where the stress relief layer 135 is provided so as to have light-blocking effects, the semiconductor package 1 can cause the stress relief layer 135 to fulfill the functions of the first surface light shielding film 132 and the second surface light shielding film 133. Accordingly, since the first surface light shielding film 132 and the second surface light shielding film 133 can be omitted in the semiconductor package 1, the manufacturing process can be further simplified and the manufacturing cost can be further reduced.

As shown in FIG. 8C, the first surface S1 of the sealing glass 130 may be further provided with a metal film 137 separated from the connection wiring layer 131. Specifically, the metal film 137 may be provided in a region not superimposed on the pixel region 111 of the semiconductor chip 110, so as to be separated from the connection wiring layer 131. As with the connection wiring layer 131, the metal film 137 is provided with, for example, copper (Cu), and blocks light entering the region not superimposed on the pixel region 111 of the semiconductor chip 110.

In such a case, the semiconductor package 1 can further improve the light-blocking effects of the sealing glass 130 in the region not superimposed on the pixel region 111 of the semiconductor chip 110, and therefore can further suppress stray light entering the semiconductor chip 110. Furthermore, in the semiconductor package 1, since the metal film 137 and the connection wiring layer 131 can be formed in the same step, stray light entering the semiconductor chip 110 can be suppressed at low cost.

(3.3. Modification of Mounting Substrate)

Subsequently, a third modification of the semiconductor package 1 according to the present embodiment will be described with reference to FIG. 9. FIG. 9 is a vertical cross-sectional view showing a configuration of a semiconductor package 2 according to the third modification.

As shown in FIG. 9, the mounting substrate 120 of the semiconductor package 2 may be further provided with a high-speed transmission via 125 that directly electrically connects the semiconductor chip 110 and wiring 142 included in the back wiring layer 140.

Specifically, the high-speed transmission via 125 is made of a conductive material and provided, penetrating the mounting substrate 120, immediately below the region where the semiconductor chip 110 is mounted. On the other hand, a connection pad 115 extracting a signal and the like is provided the back surface of the semiconductor chip 110 which is opposite to the light incident surface. The high-speed transmission via 125 can electrically connect the semiconductor chip 110 and the wiring 142 of the back wiring layer 140 by a path that is shorter and has less reflection, by linearly connecting the connection pad 115 and the wiring 142 of the back wiring layer 140. Thus, the high-speed transmission via 125 can transmit a signal from the semiconductor chip 110 to the outside of the semiconductor package 2 at higher speed.

4. Conclusion

As described above, in the semiconductor package 1 according to the present embodiment, since the semiconductor chip 110, the mounting substrate 120, and the sealing glass 130 have approximately the same thermal expansion coefficient, distortion that occurs therebetween when temperature cycling is performed can be further reduced. Thus, in the semiconductor package 1, since the size of the substrate connection part 122 can be further reduced, the outer peripheral region of the mounting substrate 120 in which the substrate connection part 122 is provided can be reduced, thereby further reducing the size of the package. In addition, in the semiconductor package 1, making the size of the substrate connection part 122 smaller can lead to a more reduced parasitic capacitance of the substrate connection part 122 and suppression of impedance mismatch between the connection wiring layer 131 and the wiring 152 included in the front wiring layer 150.

Furthermore, in the semiconductor package 1 according to the present embodiment, many chip connection parts 112 and substrate connection parts 122 can be electrically connected at once by the connection wiring layer 131 provided in the sealing glass 130. Therefore, the semiconductor package 1 can reduce the manufacturing cost. In addition, in the semiconductor package 1, by controlling the thickness and the like of the connection wiring layer 131 provided in the sealing glass 130, many chip connection parts 112 and substrate connection parts 122 can be electrically connected at once while mixing a plurality of connection wiring layers 131 of different thicknesses.

Moreover, in the semiconductor package 1 according to the present embodiment, since the semiconductor chip 110 is mounted on the entire surface of the mounting substrate 120, warpage of the semiconductor chip 110 can be suppressed more than when being mounted via a plurality of contact points. Further, in the semiconductor package 1, since the sealing part 160 can be provided so as not to be in contact with the semiconductor chip 110, the occurrence of warpage in the semiconductor chip 110 can be prevented by the contraction stress occurring due to curing of the sealing part 160. Therefore, in the semiconductor package 1, distortion of the captured image can be prevented even when an image sensor chip having a higher definition pixel pitch is used as the semiconductor chip 110.

Although the preferred embodiments of the present disclosure have been described in detail with reference to the accompanying drawings as described above, the technical scope of the present disclosure is not limited to such examples. It is apparent that those having ordinary knowledge in the technical field of the present disclosure could conceive various modified examples or changed examples within the scope of the technical ideas set forth in the claims, and it should be understood that these also naturally fall within the technical scope of the present disclosure.

Further, the effects described in the present specification are merely explanatory or exemplary and are not intended as limiting. That is, the techniques according to the present disclosure may exhibit other effects apparent to those skilled in the art from the description herein, in addition to or in place of the above effects.

Further, the following configurations also fall within the technical scope of the present disclosure.

(1)

A semiconductor package, including:

a mounting substrate;

a semiconductor chip having a smaller area than the mounting substrate and mounted on a main surface of the mounting substrate;

a sealing glass facing the semiconductor chip and the mounting substrate, connected to the mounting substrate by a substrate connection part, and connected to the semiconductor chip by a chip connection part; and a connection wiring layer provided on a first surface of the sealing glass that faces the mounting substrate and the semiconductor chip, and electrically connected to the mounting substrate and the semiconductor chip via the substrate connection part and the chip connection part, wherein the mounting substrate, the semiconductor chip, and the sealing glass have approximately the same thermal expansion coefficient.

(2)

The semiconductor package according to (1) above, wherein the chip connection part is provided in an outer peripheral region of the semiconductor chip, and the substrate connection part is provided in a region of the mounting substrate that surrounds the semiconductor chip.

(3)

The semiconductor package according to (1) or (2) above, wherein a level of the substrate connection part provided in the mounting substrate and a level of the chip connection part provided in the semiconductor chip are approximately the same.

(4)

The semiconductor package according to any one of (1) to (3) above, wherein at least one or more of the substrate connection part and the chip connection part include a solder.

(5)

The semiconductor chip according to any one of (1) to (4) above, wherein the semiconductor chip includes an image sensor chip.

(6)

The semiconductor package according to (5) above, wherein the first surface of the sealing glass is provided with a metal film at a region not superimposed on a pixel region of the image sensor chip.

(7)

The semiconductor package according to (6) above, wherein the metal film is provided away from the connection wiring layer.

(8)

The semiconductor package according to any one of (5) to (7) above, wherein a second surface of the sealing glass opposite to the first surface is provided with a light shielding film at a region not superimposed on a pixel region of the image sensor chip.

(9)

The semiconductor package according to any one of (1) to (8) above, wherein the connection wiring layer is provided on the first surface of the sealing glass via a stress relief layer containing an organic resin.

(10)

The semiconductor package according to (9) above, wherein the stress relief layer has light-blocking effects.

(11)

The semiconductor package according to any one of (1) to (10) above, further including:

a back wiring layer provided on a surface opposite to the main surface of the mounting substrate on which the semiconductor chip is mounted; and a through via that is provided so as to penetrate the mounting substrate at the region provided with the substrate connection part, and electrically connects the back wiring layer and the substrate connection part.

(12)

The semiconductor package according to (11) above, further including a high-speed transmission via that is provided so as to penetrate the mounting substrate at the region in which the semiconductor chip is mounted, and directly electrically connects the back wiring layer and the semiconductor chip.

(13)

The semiconductor package according to any one of (1) to (12) above, wherein the mounting substrate includes a glass core.

(14)

The semiconductor package according to any one of (1) to (13) above, wherein the mounting substrate and the sealing glass are attached to each other by a sealing part provided in an outer peripheral region of the mounting substrate and the sealing glass, to seal the inside.

(15)

The semiconductor package according to (14) above, wherein the sealing part is provided so as to incorporate the substrate connection part.

(16)

The semiconductor package according to (14) or (15) above, wherein the sealing part includes a functional resin with light-blocking effects or air permeability.

REFERENCE SIGNS LIST 1, 2 Semiconductor package
110 Semiconductor chip
111 Pixel region
112 Chip connection part
112A Glass-side contact point
112B Chip-side contact point
113 Die bond layer
115 Connection pad
120 Mounting substrate
122 Substrate connection part
122A Glass-side contact point
122B Substrate-side contact point
123 Through via
125 High-speed transmission via
130 Sealing glass
131 Connection wiring layer
132 First surface light shielding film
133 Second surface light shielding film 135 Stress relief layer
137 Metal film
140 Back wiring layer
150 Front wiring layer
160 Sealing part

What is claimed is:

1. A semiconductor package, comprising:

a mounting substrate;

a semiconductor chip having a smaller area than the mounting substrate and mounted on a main surface of the mounting substrate;

a sealing glass facing the semiconductor chip and the mounting substrate, connected to the mounting substrate by a substrate connection part, and connected to the semiconductor chip by a chip connection part; and a connection wiring layer provided on a first surface of the sealing glass that faces the mounting substrate and the semiconductor chip, and electrically connected to the mounting substrate and the semiconductor chip via the substrate connection part and the chip connection part, wherein the mounting substrate, the semiconductor chip, and the sealing glass have approximately the same thermal expansion coefficient.

2. The semiconductor package according to claim 1, wherein the chip connection part is provided in an outer peripheral region of the semiconductor chip, and the substrate connection part is provided in a region of the mounting substrate that surrounds the semiconductor chip.

3. The semiconductor package according to claim 1, wherein a level of the substrate connection part provided in the mounting substrate and a level of the chip connection part provided in the semiconductor chip are approximately the same.

4. The semiconductor package according to claim 1, wherein at least one or more of the substrate connection part and the chip connection part include a solder.

5. The semiconductor package according to claim 1, wherein the semiconductor chip includes an image sensor chip.

6. The semiconductor package according to claim 5, wherein the first surface of the sealing glass is provided with a metal film at a region not superimposed on a pixel region of the image sensor chip.

7. The semiconductor package according to claim 6, wherein the metal film is provided away from the connection wiring layer.

8. The semiconductor package according to claim 5, wherein a second surface of the sealing glass opposite to the first surface is provided with a light shielding film at a region not superimposed on a pixel region of the image sensor chip.

9. The semiconductor package according to claim 1, wherein the connection wiring layer is provided on the first surface of the sealing glass via a stress relief layer containing an organic resin.

10. The semiconductor package according to claim 9, wherein the stress relief layer has light-blocking effects.

11. The semiconductor package according to claim 1, further comprising:

a back wiring layer provided on a surface opposite to the main surface of the mounting substrate on which the semiconductor chip is mounted; and a through via that is provided so as to penetrate the mounting substrate at the region provided with the substrate connection part, and electrically connects the back wiring layer and the substrate connection part.

12. The semiconductor package according to claim 11, further comprising a high-speed transmission via that is provided so as to penetrate the mounting substrate at the region in which the semiconductor chip is mounted, and directly electrically connects the back wiring layer and the semiconductor chip.

13. The semiconductor package according to claim 1, wherein the mounting substrate includes a glass core.

14. The semiconductor package according to claim 1, wherein the mounting substrate and the sealing glass are attached to each other by a sealing part provided in an outer peripheral region of the mounting substrate and the sealing glass, to seal the inside.

15. The semiconductor package according to claim 14, wherein the sealing part is provided so as to incorporate the substrate connection part.

16. The semiconductor package according to claim 14, wherein the sealing part includes a functional resin with light-blocking effects or air permeability.

* * * * *